(12) United States Patent
Dangler et al.

(10) Patent No.: US 7,086,869 B1
(45) Date of Patent: Aug. 8, 2006

(54) FLEXIBLE CABLE INTERCONNECT WITH INTEGRATED EMC SHIELDING

(75) Inventors: John Richard Dangler, Rochester, MN (US); Matthew Stephen Doyle, Rochester, MN (US); Thomas Donald Kidd, Stewartville, MN (US); Bradley Lewis Martin, Byron, MN (US); Kevin J. Przybylski, Rochester, MN (US); Jason Thomas Stoll, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/038,708

(22) Filed: Jan. 20, 2005

(51) Int. Cl.
*H01R 12/00* (2006.01)

(52) U.S. Cl. ............... 439/67; 439/502; 174/117 F

(58) Field of Classification Search ............ 174/117 F, 174/36; 361/792; 439/67, 502
See application file for complete search history.

(56) References Cited

U.S. PATENT DOCUMENTS

| | | | |
|---|---|---|---|
| 4,798,918 A * | 1/1989 | Kabadi et al. ............... 174/36 |
| 6,739,878 B1 * | 5/2004 | Balzano ...................... 439/67 |
| 6,743,054 B1 * | 6/2004 | Wu ............................. 439/638 |
| 6,786,762 B1 * | 9/2004 | Buck et al. ................. 439/493 |

* cited by examiner

*Primary Examiner*—Khiem Nguyen
(74) *Attorney, Agent, or Firm*—Robert W. Lahtinen

(57) ABSTRACT

In a flat flex cable, signal lines are surrounded by logic ground planes above and below which are viaed together left and right. The ground planes coupled with the flex cable dielectric determine characteristic the impedance and attenuation of the cable and provide differential signal EMI shielding. All signal layers and logic ground planes are enclosed within the two outermost shield layers which are viaed together left and right and around the connectors to enclose both signal layers and logic ground planes to provide common mode EMI shielding.

12 Claims, 2 Drawing Sheets

FLEXIBLE CABLE INTERCONNECT WITH INTEGRATED EMC SHIELDING

FIELD OF THE INVENTION

The invention pertains to flat flex cables and more particularly to EMC (electromagnetic compatibility) shielded and grounded flex cables for use externally between devices.

BACKGROUND OF THE INVENTION

Electronic systems composed of multiple devices housed in separate enclosures commonly require external signal interconnects between devices. These systems require that integrated EMC shielding be provided in the flexible cabling extending between enclosures. It is not unusual to find that the external connecting cables are among the largest structures in the system, with the result that common mode currents on these cables are almost always the source of an EMI (electromagnetic interference) problem. To control both differential mode and common mode signals it is necessary to provide both logic ground shielding about the signal lines and secondary frame ground shielding about the logic ground shielding.

High performance double shielded coaxial cables are a solution, but are too bulky and require large radius bends and as a result are not suitable for use in current state of the art devices that are continuously attempting to achieve smaller, more compact device sizes.

SUMMARY OF THE INVENTION

This invention provides integrated EMC shielding and grounding for flex cables allowing them to be used externally of device enclosures to afford interconnection. The high density flexible interconnecting cable includes a combination of high performance signals enclosed within and referencing surrounding logic ground planes, surrounded by frame ground shield layers which are viaed together at the external boundaries of the cable throughout the cable's entire length, thus forming an external cable shield. These outer frame ground layers are then physically connected to the frame or chassis ground of the connected device at both the source and termination locations of the cable. This combination of surrounding the signals with both logic ground and then frame ground controls both the differential mode and common mode EMI, necessary for high performance EMI shielding, as well as providing the controlled impedance necessary for signal integrity in a high speed interconnect environment. The advantages of this flat flex cable design is high performance EMI shielding of a high density pin count interconnect that can be used where a small bend radius is required while still retaining enough flexibility for concurrent maintenance.

DETAILED DESCRIPTION

Figure 1:
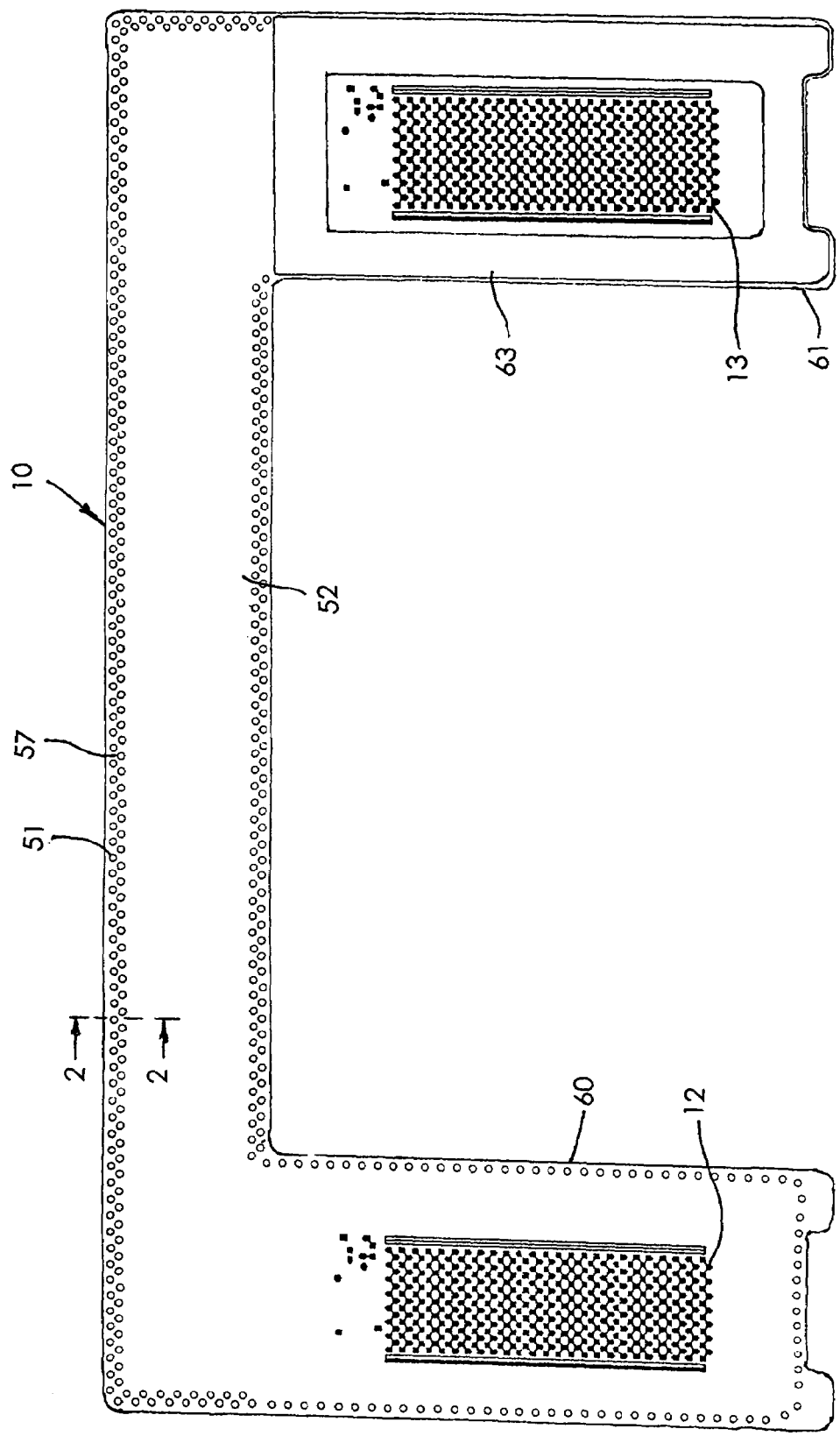
FIG. 1 shows a flex cable incorporating the present invention with one plate member surrounding a connector site removed to illustrate the frame ground via sequence.

FIG. 1 illustrates an example of the shielded flat flexible cable 10 of the present invention as an external cable assembly for interconnecting signal lines of two devices that connect to the cable at the high density pin connector sites 12 and 13. The layered structure of the cable is shown in FIG. 2 taken along line 2—2 of FIG. 1, with an exploded view of FIG. 2 shown in FIG. 3 wherein the individual layers of dielectric material and the coatings of etched copper and adhesive are identified.

Figure 3:
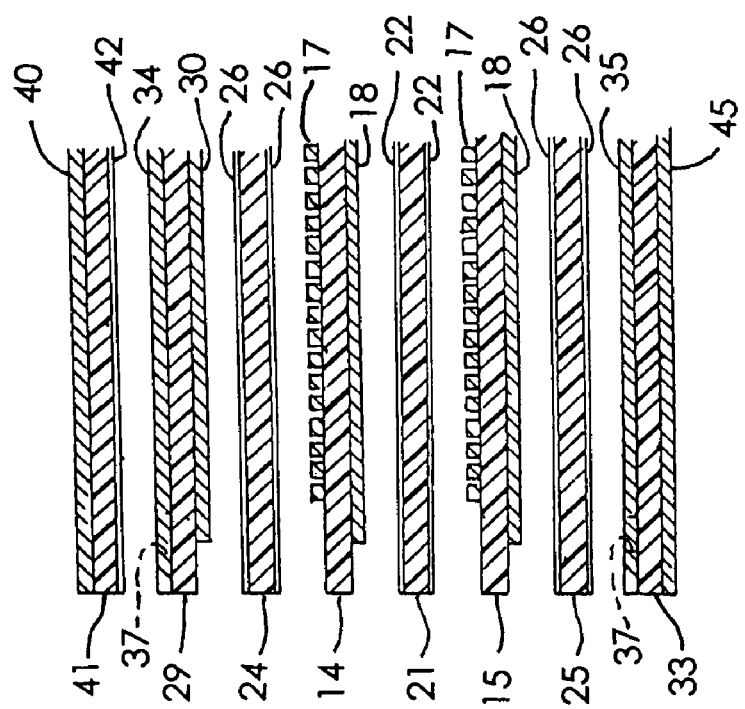
FIG. 3 is an exploded schematic view of the dielectric layers of FIG. 2 including the copper and adhesive layers prior to assembly.

As seen in the exploded view of FIG. 3, the flexible cable 10 is formed of a series of dielectric layers which separate the various etched copper layers. A typical dielectric used for these layers is polyimide film. The dielectric layers 14 and 15 each have an upper copper coating which is etched to form a series of conductive traces 17 and carries on the lower surface a copper coating 18 which extends laterally beyond the conductive traces 18, but is etched away from the outer edge of cable 10 to form a logic ground plane. The conductive traces 17 are principally signal lines, but may also include logic ground lines which cooperate the logic ground planes and dielectric material characteristics to optimize signal line performance or reduce signal line emissions. As shown, cable 10 contains two layers of conductive traces 17, but the cable could be designed with a single layer or three or more layers of conductive traces to meet the requirements of the devices that are to be interconnected. The polyimide dielectric layer 21 carries adhesive coatings 22 on each side and functions to separate the ground plane 18 from the conductive traces 17. Dielectric layers 24 and 25 (similarly coated on each side with adhesive coatings 26) provide electrical isolation of the conductive trace layers from the adjacent conductive layers.

Dielectric layer 29 has a logic ground plane copper surface 30 at the lower surface which, like logic ground planes 18, extends over conductive traces 17, but is etched away at the cable edge. Thus, copper layers 18 and 30 function to provide a logic ground plane immediately above and below each layer of conductive traces 17. The upper surfaces of dielectric layers 29 and 33 are respectively coated with copper layers 34 and 35, which are the principal conductive surfaces forming the frame ground to provide the common mode EMI shielding. Each of the copper layers 34 and 35 extend to the edge or near to the edge of the polyimide dielectric layer upon which they are formed and thereby to the edge or near to the edge of the cable assembly 10. The copper layers 34 and 35 are etched to form generally circular voids 37 which are aligned with the margins of the logic ground planes 18 and 30 to enable vias to be formed subsequently that connect the logic ground planes, but are electrically isolated from the frame ground planes 34 and 35. A final pad cap layer 40 is provided at the upper surface of the cable assembly 10 as a copper layer on polyimide dielectric layer 41. Dielectric layer 41 has an adhesive layer 42 on the lower surface to enable attachment to the frame ground layer 37. A similar copper pad cap layer 45 is presented at the lower surface of the dielectric layer 33. The pad cap layers 40 and 45 are subsequently etched to remove the copper from all, but the pad caps which are utilized to enable via interconnects for the ground planes as described below and for signal line interconnecting vias which are not further described herein.

Figure 2:
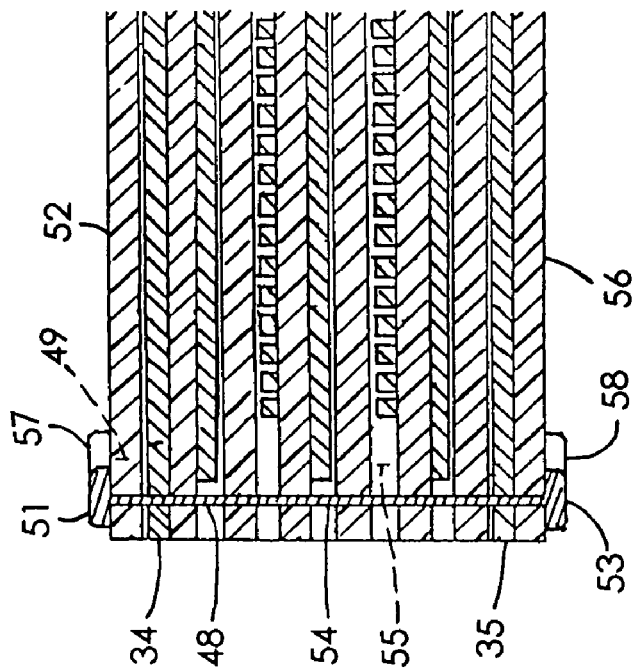
FIG. 2 is a schematic view of the cable structure taken along line 2—2 of FIG. 1.

FIG. 2 is a section of the cable edge showing the assembled condition of the cable 10. FIGS. 2 and 3 are schematic views for purposes of illustration, wherein the layer thicknesses are not to scale. In FIG. 2 the thickness of the assembly adjacent the outer edge would actually be modestly reduced as a consequence of the copper layers that do not extend to the cable edge. With the dielectric layers compressed together and bonded by the adhesive coatings, two series of holes 48 and 49 are drilled through the assembly to enable plated through vias to be formed. Along the entire perimeter of the cable a series of vias 54 are formed, each extending through a drilled hole 48 between a pad 51 at the upper surface 52 and a pad 53 at the lower surface 56. The outermost row of vias 54 each electrically connects the upper ground frame layer 34 to the lower ground frame layer 35 and together form a sequence of electrical connections. An inner row of vias 55, each extending from an upper pad cap 57 to a lower pad cap 58 and through openings 37 in the frame ground layers 34 and 35, interconnect the logic ground plane layers 18 and 30 disposed above and below each of the conductive trace layers 17. The inner row of vias 55 form a sequence of periodic electrical connecting means which extends along the length of the cable assembly, but are not present in the interconnect areas about the high density interconnect sites 12 and 13 of the cable assembly.

The spacing between the outer row of frame ground vias 54 is selected such that the space between adjoining vias is smaller than the wave length of the highest frequency signal encountered on the signal lines. The sequence of inner row logic ground vias are longitudinally staggered with respect to the outer row vias 54 so that the vias of one sequence are aligned with the spaces separating vias of the other sequence. The staggered via rows thereby maximize the optical coverage as viewed from the cable edge to maximize the shielding effectiveness of the overall shielding system.

As seen in FIG. 1, the series of pad caps 51 and the sequence of vias connecting the marginal edge portions of the frame ground planes to which they are connected extend about the entire periphery of the cable 10 including the terminal end portions 60 and 61. The terminal end portions include a metal plate member 63 which overlies the cable and surrounds the connector site such as site 13 of terminal end 61. Terminal end 60 is shown with the plate removed to reveal the continuous row of via pad caps 51 about the edge of the cable assembly. The plate 63, as shown installed on terminal end 61, is bonded to the cable and electrically connected to the underlying pad caps 51 to afford a positive frame ground connection as the plate 63 engages the frame of the device attached at the connector site 13. The frame ground planes of the cable 10 that, in cooperation with vias 54, surround the logic ground structure and signal lines are thus connected to the device frame ground at each end of the cable assembly.

Those of ordinary skill in the art will appreciate that pins in high density pin connector sites 12 and 13 are connected to traces in conductive traces 17 using conventional interconnection techniques, such as vias, to interconnect conducting elements on different conductor levels of a printed circuit board or cable, the different conducting levels separated by dialectric material.

While a particular embodiment of the invention has been illustrated and described, it would be obvious to those skilled in the art that various other combinations and modifications can be made without departing from the scope of the invention. For example, other techniques than plated through vias may be employed to electrically "stitch" together the margins of the frame ground planes and the logic ground planes to effect the common mode and differential mode shielding for EMI control while maintaining the flex cable characteristics for optimum external connection of electronic devices. It is therefore intended to cover in the appended claims all such combinations and modifications that are within the scope of this invention.

What is claimed is:

1. A shielded flat flexible cable comprising
   at least one series of conductor traces secured to the surface of a dielectric support layer;
   first and second conductive logic ground layers disposed respectively above and below said at least one series of conductor traces and separated therefrom by a layer of dielectric material;
   third and fourth conductive frame ground layers respectively disposed above said first conductive logic ground layer and below said second conductive logic ground layer and separated therefrom by a layer of dielectric material;
   said third and fourth conductive frame ground layers extending laterally beyond said first and second logic ground layers; and
   periodic electrical connecting means electrically connecting said third and fourth conductive frame ground layers along the marginal edge portions of said frame ground layers which extend laterally beyond said first and second conductive logic ground layers.

2. The shielded flat flexible cable of claim 1 wherein said periodic electrical connecting means comprises a first sequence of plated through vias which electrically connect said third and fourth conductive frame ground layers at locations beyond the lateral edges of said first and second conductive logic ground layers.

3. The shielded flat flexible cable of claim 2 wherein adjoining plated through vias of said electrical connecting means are separated by a distance which is smaller than the wave length of the highest frequency signal carried by said conductor traces.

4. The shielded flat flexible cable of claim 3 wherein said third and fourth conductive frame ground layers comprise a common mode EMI shield which is electrically connected to a device frame adjacent each cable end.

5. The shielded flat flexible cable of claim 2 wherein said cable comprises a plurality of layers of conductive traces with a logic ground layer, similar to said first and second conductive logic ground layers, positioned between and electrically isolated from each of the adjoining layers of conductor traces.

6. The shielded flat flexible cable of claim 5 further comprising a second sequence of plated through vias electrically interconnecting said conductive logic ground layers laterally outward with respect to signal carrying traces of each said layer of conductive traces, said second sequence of plated through vias being laterally inward and longitudinally staggered with respect to said first sequence of plated through vias.

7. A shielded flat flexible cable comprising:
   at least one series of conductive traces secured to the surface of a dielectric support layer;
   first and second conductive logic ground layers respectively disposed above said first conductive logic ground layer and below said second conductive logic ground layer and separated therefrom by a layer of dielectric material;
   third and fourth conductive frame ground layers respectively disposed above said first conductive logic ground layer and below said second conductive logic ground layer and separated therefrom by a layer of dielectric material; and a series of periodic electrical connecting means electrically connecting said third and fourth conductive frame ground layers along marginal edge portions of said frame ground layers causing the frame ground to surround and be electrically isolated from said conductive traces and said first and second logic ground layers.

8. The shielded flat flexible cable of claim 7 wherein said periodic electrical connecting means comprises a first sequence of plated through vias which electrically connect said third and fourth conductive frame ground layers.

9. The shielded flat flexible cable of claim 8 where adjoining plated through vias of said electrical connecting means are separated by a distance which is smaller than the wave length of the highest frequency signal carried by said conductive traces.

10. The shielded flat flexible cable of claim 8 wherein said cable comprises a plurality of layers of conductive traces with an intervening logic ground layer positioned between and electrically isolated from each of the adjoining layers of conductive traces.

11. The shielded flat flexible cable of claim 10 further comprising a second sequence of plated through vias electrically connecting said first and second logic ground layers and said intervening logic ground layers laterally outward with respect to signal carrying traces of said layers of conductive traces.

12. The shielded flat flexible cable of claim 11 wherein said second sequence of plated through vias are positioned laterally inward and electrically isolated from said first sequence of plated through vias and longitudinally staggered with respect to said first sequence of plated through vias.

* * * * *